United States Patent [19]

Slater

[11] Patent Number: 5,309,327
[45] Date of Patent: May 3, 1994

[54] APPARATUS AND METHOD FOR MANUFACTURING PRINTED CIRCUIT BOARDS

[75] Inventor: Cody Z. Slater, Calgary, Canada

[73] Assignee: Platform Systems Inc., Calgary, Canada

[21] Appl. No.: 983,222

[22] Filed: Nov. 30, 1992

[51] Int. Cl.⁵ .............................................. G11C 11/00
[52] U.S. Cl. ........................ 361/805; 361/744; 361/748; 361/785; 361/807; 174/250; 174/261; 439/48
[58] Field of Search ............... 361/395, 396, 397, 399, 361/400, 412, 413, 416, 417, 420, 736, 741, 744, 748, 752, 760, 784, 785, 805, 807, 810; 439/48; 174/250, 255, 261, 262

[56] References Cited

U.S. PATENT DOCUMENTS

| | | | |
|---|---|---|---|
| 3,071,876 | 1/1963 | Swanberg | 35/19 |
| 3,234,629 | 6/1966 | Wheeler | 29/155.5 |
| 3,912,983 | 10/1975 | Lowry, Jr. | 317/101 |
| 3,952,410 | 4/1976 | Garretson et al. | 29/628 |
| 4,357,062 | 11/1982 | Everett | 339/18 |
| 4,443,756 | 4/1984 | Lightbody et al. | 324/73 |
| 4,488,354 | 12/1984 | Chan et al. | 29/830 |
| 4,644,269 | 2/1987 | Golder et al. | 324/158 |
| 4,698,906 | 10/1987 | Minar et al. | 29/842 |
| 4,812,754 | 3/1989 | Tracy et al. | 324/158 |
| 4,854,039 | 8/1989 | Wendt | 29/832 |
| 4,907,127 | 3/1990 | Lee | 361/397 |
| 4,947,112 | 8/1990 | Gaston et al. | 324/158 |
| 4,952,872 | 8/1990 | Driller et al. | 324/158 |
| 5,087,878 | 2/1992 | Belmore, III | 324/158 |

Primary Examiner—Leo P. Picard
Assistant Examiner—Young Whang
Attorney, Agent, or Firm—Anthony R. Lambert

[57] ABSTRACT

A circuit board assembly system for manufacturing a prototype printed circuit board having a matrix formed in it. A base board having a connection matrix that matches the matrix of the printed circuit board is hinged to a frame having tracks for receiving the printed circuit board, so that the printed circuit board is locatable in a fixed position in relation to the printed circuit board with their respective matrices matching. Component leads may be inserted into the connection matrix through the printed circuit board to form a circuit, which may be tested. The base board may be pivoted away from the printed circuit board to allow the leads to be soldered. The printed circuit board may then be removed from the base board. A cover that is latchable onto the printed circuit board may be used to prevent components from being accidentally removed from the printed circuit board.

11 Claims, 7 Drawing Sheets

APPARATUS AND METHOD FOR MANUFACTURING PRINTED CIRCUIT BOARDS

FIELD OF THE INVENTION

This invention relates to an apparatus and a method for manufacturing prototype printed circuit boards.

BACKGROUND OF THE INVENTION

A printed circuit board is formed from a thin board of electrically non-conducting material in which is formed a partly connected and partly disconnected network or matrix of electrically conducting elements. To make a particular circuit on a printed circuit board, components must be placed on the board with electrical connections between them being made by the matrix. However, many electrical circuits are quite complex and require much testing and moving around of the circuit components. This means that the circuit board on which the original circuit is placed should allow the leads to be easily removed from the board and re-inserted into the board, while making good electrical connections when inserted into the board. For this reason, a breadboard is often used to prepare the initial circuit. The breadboard has a particular matrix of electrically connecting elements and this matrix is used to connect the components. Once the prototype circuit is made and proven to be functional, it must be converted to a prototype printed circuit board. This is accomplished largely as follows.

1. The layout of the circuit is copied onto paper.
2. An experimenter's board of a suitable size is obtained. This board will have its own matrix of electrical connections that will not necessarily match the breadboard matrix.
3. The circuit layout from the breadboard matrix is converted to a matrix suitable for the type of experimenter's board being used.
4. All components are removed from the breadboard and placed on the experimenter's board according to the layout developed in step 3.
5. All components and jumper wires are soldered in place on the experimenter's board, and traces cut.

At this stage a hard wired prototype now exists, and is ready to be tested. However due to the complexity of this process there is considerable room for errors to be made and it is typical that even an experienced technician will expect to have to spend substantial additional time retracing and debugging the board.

SUMMARY OF THE INVENTION

With the system of the present invention, this entire process is unnecessary. Using the system of the present invention, the initial breadboard prototype is turned into a hard wired prototype in one simple step. This is accomplished by the printed circuit board in effect creating the surface of the connector matrix which, once the prototype is functional, is removed from the connector matrix and soldered to create the final prototype. This unique process is believed to reduce the time required to produce a prototype by approximately 90% and to ensure that each prototype board will be fully functional upon completion.

There is therefore provided in accordance with one aspect of the invention, a circuit board assembly system for manufacturing a prototype printed circuit board having a matrix formed in it, the assembly system comprising:

a base board having a connection matrix that matches the matrix of the printed circuit board; and positioning means connectable to each of the base board and the printed circuit board for locating the printed circuit board in a fixed position relative to the base board.

According to a further aspect of the invention, there is provided a method of constructing a prototype board using a base board having a connection matrix, the prototype board having a matching matrix that matches the connection matrix, the method comprising the steps of:

locating the prototype board in a fixed position relative to the base board with the matching matrix aligned with the connection matrix;

inserting components having leads into the prototype board with the leads extending into the base board in electrical connection with the connection matrix to form a circuit;

testing the circuit;

removing the base board from the fixed position in relation to the prototype board; and soldering the leads of the components into the prototype board.

Further aspects of the invention will be found in the detailed description of the invention and in the claims that follow.

BRIEF DESCRIPTION OF THE DRAWINGS

There will now be described a preferred embodiment of the invention, with reference to the drawings, by way of illustration, in which like numerals denote like elements and in which.

DETAILED DESCRIPTION OF PREFERRED EMBODIMENTS

In this patent document and particularly as used in the claims: "connection matrix" in relation to a board means a matrix of partially connected and partially separated electrically conducting elements that permits numerous circuit designs to be formed on the board, depending on the placement of electrical components on the matrix; "matching matrix" in relation to a given connection matrix means a matrix of partially connected and partially separated electrically conducting elements which has the same (a matching) layout as the connection matrix; "electrically conducting element" means an electrical conducting wire or strip or similar device whose primary purpose is to conduct electricity; and "components" includes resistors, capacitors, inductors, diodes, switches, transistors, semi-conductor chips, transformers and other small scale electrical devices.

Figure 1:
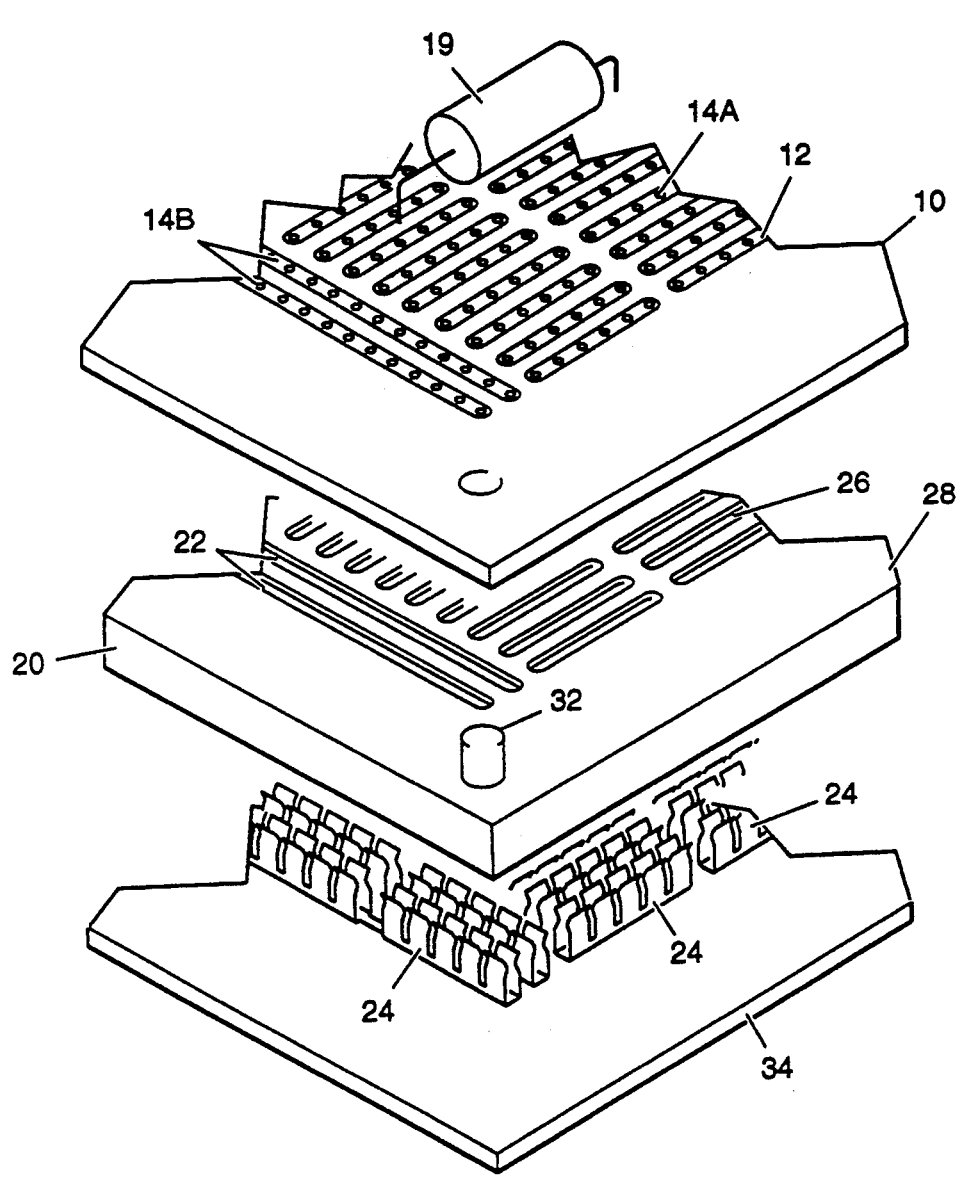
FIG. 1 is a perspective view, partly broken away and exploded, of an apparatus according to the invention with printed circuit board in place, the printed circuit board including a matrix of electrically conducting elements, some long and some short.
Figure 2A:
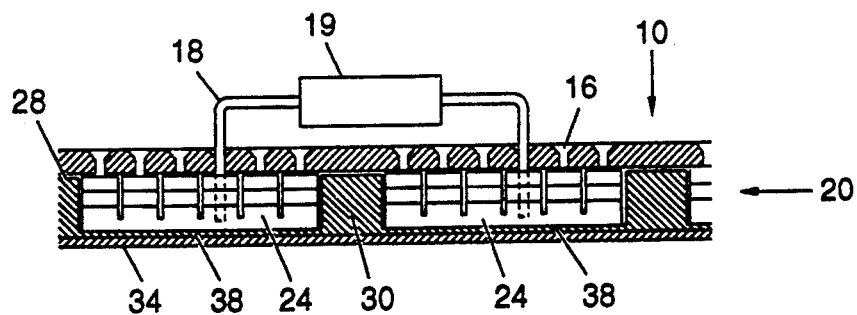
FIG. 2A is a cross-section through the apparatus shown in FIG. 1 parallel to the shorter elements with a single component shown about to be inserted in the apparatus.
Figure 2B:
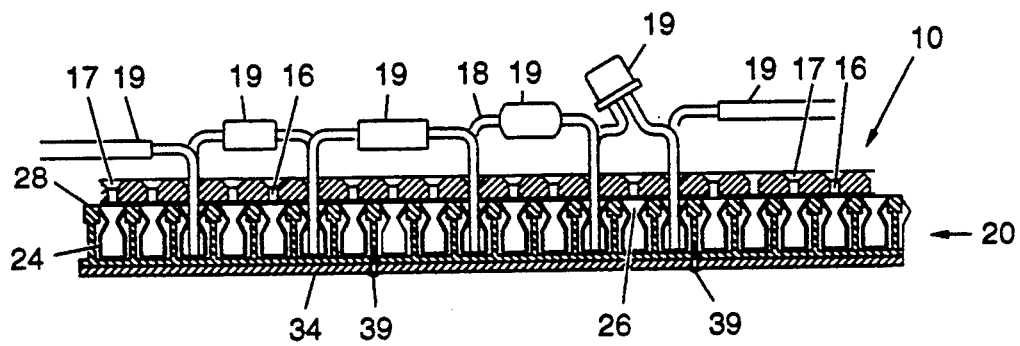
FIG. 2B is a cross-section through the apparatus shown in FIG. 1 perpendicular to the shorter elements with several components inserted in the apparatus.

Referring to FIGS. 1, 2A and 2B, a printed circuit board 10 of mostly conventional construction includes a matrix 12 of electrically conducting elements 14a and 14b. Individual electrical conducting elements 14a and 14b are shown and for example may simply form a short narrow strip 14a for receiving and connecting several leads of components, or may form a long narrow strip 14b for receiving several leads of components and connecting them to a power source. The elements 14a and 14b are for example formed from narrow copper strips with openings 16 spaced along the narrow strips. The openings 16 are preferably countersunk as shown in FIG. 2B at 17, that is, tapered at the top, to allow for easy insertion of the leads. The leads 18 of a component 19 may be inserted into the openings 16 of the electrically conducting elements 14a or 14b to extend through the printed circuit board 10.

Figure 2C:
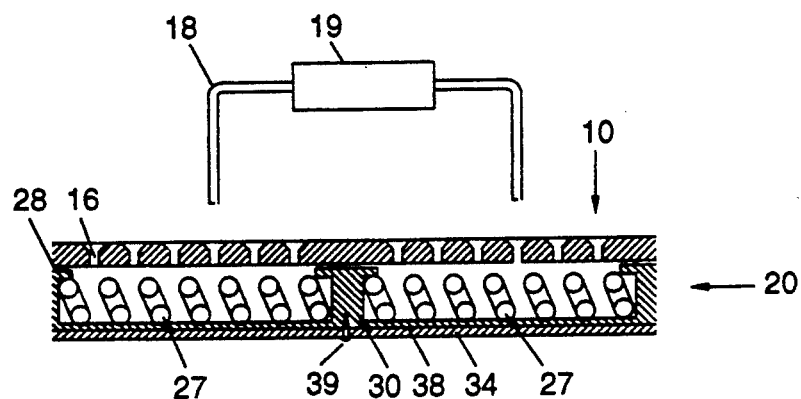
FIG. 2C is a cross-section through the apparatus shown in FIG. 1 parallel to the shorter elements with a single component shown about to be inserted in the apparatus, with springs inserted instead of clips for retaining the leads of the component.

A base board 20 is formed from a nonconducting slab-shaped base (for example made of a suitable plastic) with a matrix 22 of electrically conducting elements 24 fixed on or within the base for receiving the leads 18 of components 19 such as the resistor shown and other components (such as those shown in FIG. 2B) in the circuit being built. Individual elements 24 preferably consist of a single metal strip of clip type contacts as shown, for example chrome plated steel, whose contacts are separated no more than the width of the leads expected to be inserted into them. Each clip should have length and width slightly larger than the length and width of a corresponding one of the linear openings or slots 26 in the base board 20, each clip being disposed within the base adjacent the corresponding one of the openings 26. Referring to FIG. 2C, a potential alternative to the clip is to use a spiral metal spring 27. However, if springs are used one must be careful to avoid arcing at the contacts, that might occur if for example the contact with a lead was weak. This might occur if there were leads inserted in opposite ends of a spring, thus perhaps fixing the spring in a pulled apart position and a further lead was inserted between them. A further potential alternative to the clips or springs is to use conductive elastomeric elements. Such elements would be inserted (by injection moulding) into the base board 20, filling the slots 26. Such injection moulding could take place as a second step immediately after the moulding of the base board 20. The elastomeric elements would have holes to receive leads. Such conductive elastomeric elements have the desired advantage of contacting the lead on all sides of the lead. Conductive elastomers are commonly commercially available.

The function of an element 24 is to allow a lead to be inserted into it while making an electrical connection between the lead and the element, and to prevent the lead from slipping out easily (for example under its own weight) while allowing the lead to be readily removable from the element by hand. Hence the contact points of the element with the leads must have sufficient compression to prevent the component from falling out under its own weight.

The matrix 22 matches the matrix 12, so that there is a one to one correspondence between the electrically conducting elements 14a and 14b and the electrically conducting elements 24. Each discrepancy in the correspondence between the two matrices will tend to reduce the efficiency of the apparatus and the method of using it. Slots 26 in the upper surface 28 of the base board 20, one corresponding to each element 24, receive the leads 18 of components 19, such as the resistor shown in FIG. 2A. Barriers 30 are formed as part of the base board 20 to form chambers for receiving and holding the elements 24. The barriers 30 also form insulating barriers between adjacent elements 24. Base board 20 is attached to a base 34 by screws 39. An insulating layer 38 (see FIGS. 2B and 2C) is preferably interposed between the base 34 and the base board 20, so that the elements 24 do not make an electrical connection with the base 34.

Figure 3:
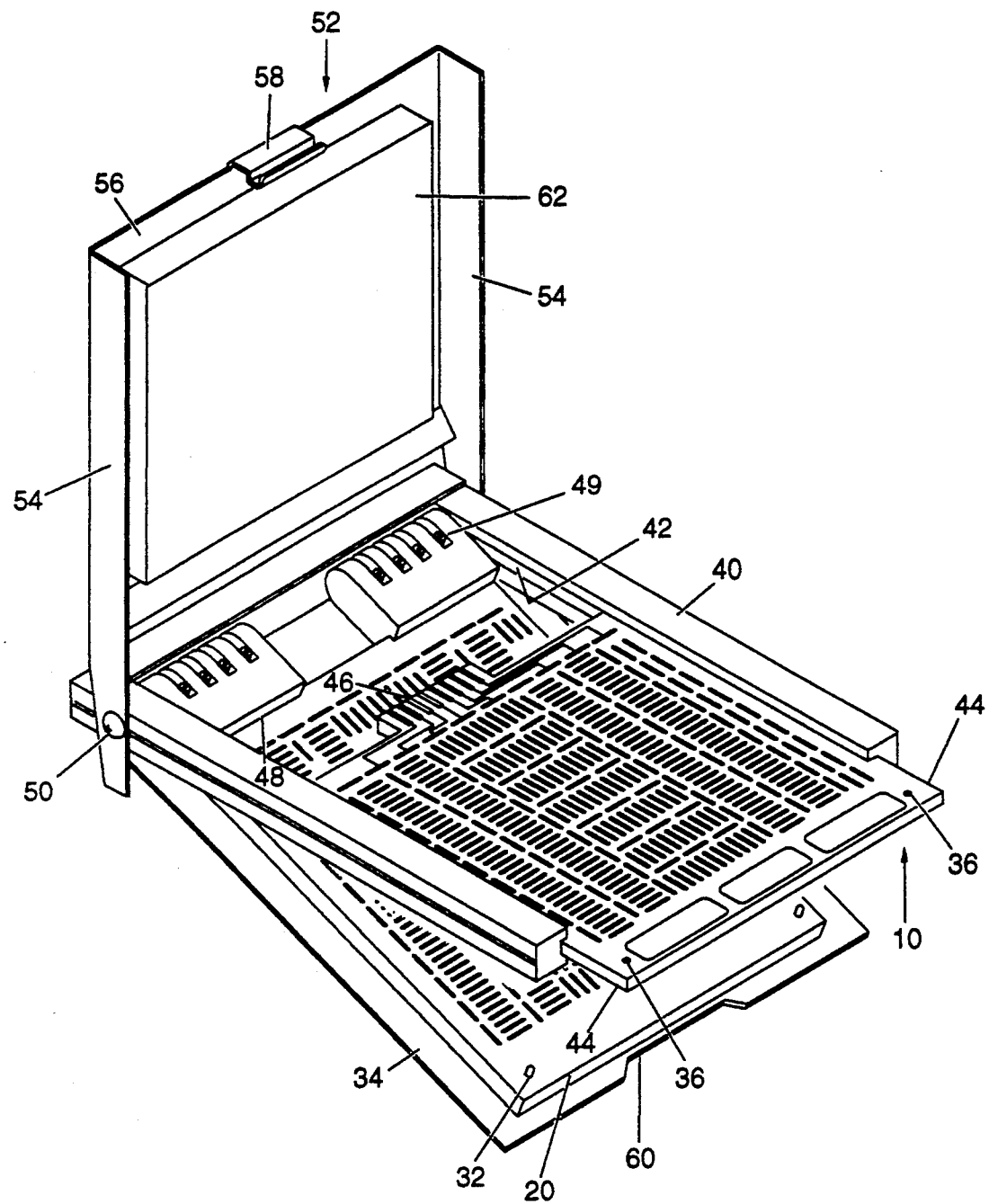
FIG. 3 is a perspective showing a printed circuit board being inserted for testing in the apparatus shown in FIG. 1 together with a cover.

Referring now also to FIG. 3, the printed circuit board 10 and the base board 20 are shown with positioning means connectable to each of the base board and the printed circuit board for locating the printed circuit board in a fixed position relative to the base board. The positioning means includes a tracking frame 40 with grooves or channels 42 for receiving the edges 44 of the printed circuit board 10. A connection edge 46 of the printed circuit board 10 mates with a matching connector 48 of the tracking frame 40. A set of terminals 49 allow external connection of leads to the connection edge 46 and thence to the matrix printed circuit board 10.

Tracking frame 40 and the base 34 are hinged to each other at a pivot 50. The end of the apparatus near the pivot is referred to as the closed end of the apparatus while the opposite end is referred to as the open end of the apparatus. A cover 52 is also hinged at the pivot 50 to the tracking frame 40 and the base 34. All three parts, the tracking frame 40, the base 34 and the cover 52 are free to rotate with respect to each other about an axis defined by the pivot 50, preferably at least over about a 135° range.

As shown in FIG. 3 and in FIG. 1, aligning posts 32 are formed in the two corners of the base board at the open end. These posts 32 are complementary to openings 36 in the printed circuit board 10, and form means to facilitate the alignment of the printed circuit board 10 and the base board 20 in relation to each other so that the matrices may be aligned with each other, one on top of the other.

The cover 52 is formed with sides 54 and top 56, with a latch 58 at the end of the cover at the open end of the apparatus. The latch 58 engages with the printed circuit board 10 when the printed circuit board is fully inserted in the tracks 40 and the cover is closed. A slot 60 in the base 34 is provided if required so that the end of the latch 58 does not contact the base board 20. A second latch (not shown) may be provided to secure the cover to the base board 20 if desired. The cover 52 preferably includes a padding and insulating material 62 such as foam rubber attached, for example with adhesive, to the under side of the cover. The tracking frame 40 and cover 52 are preferably each made of aluminum, but may be made of other suitable material. The base 34 is preferably made of steel.

Figure 4:
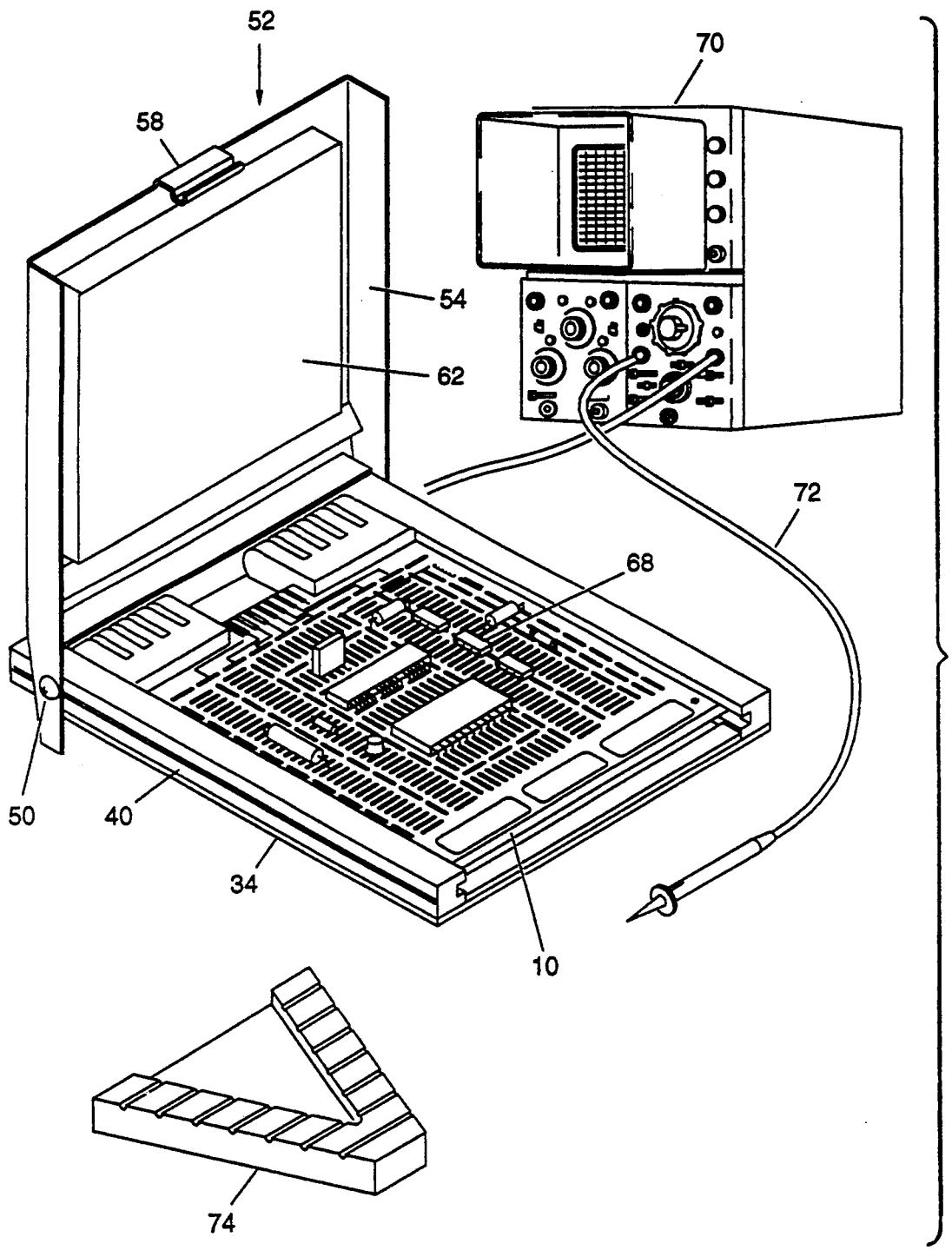
FIG. 4 is a perspective showing a printed circuit board in place for testing in the apparatus shown in FIG. 1 together with a cover.

FIG. 4 shows an apparatus according to the invention with a printed circuit board that has numerous components 19, such as chip 68 inserted into the printed circuit board 10, forming an electrical circuit, with connections between the various components 19 being made through the elements 24 forming the matching matrix of the base board 20. There is also shown an oscilloscope 70 with leads 72 and lead bending device 74 for use in testing the circuit on the printed circuit board 10.

Figure 5:
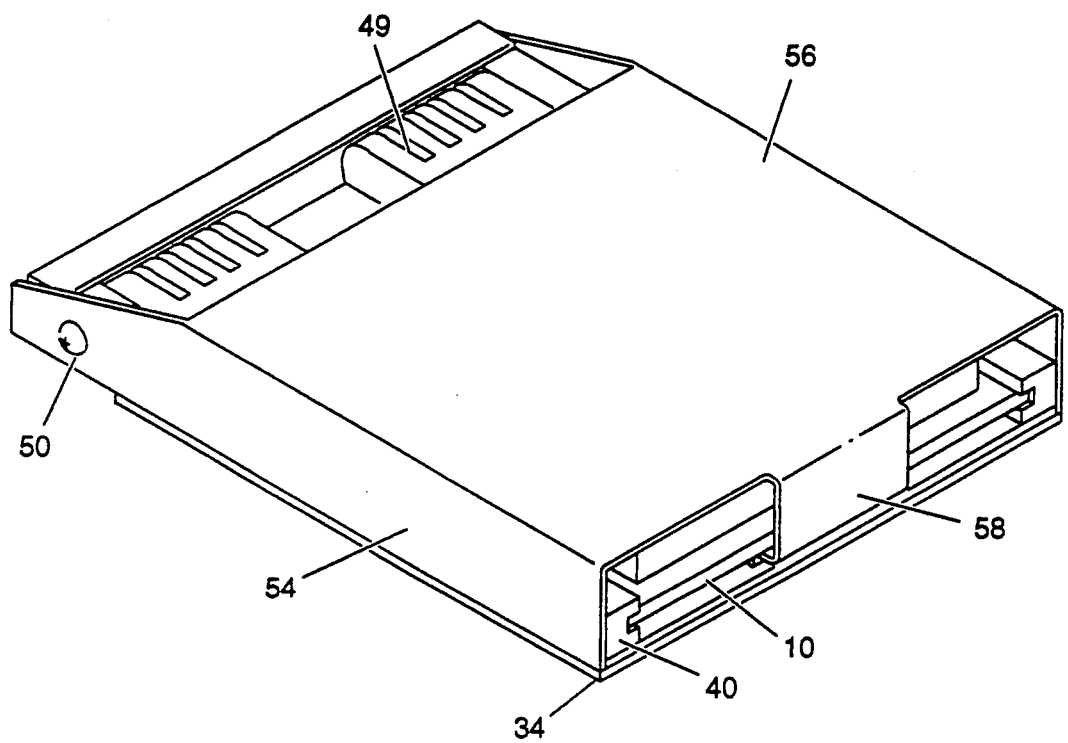
FIG. 5 is a perspective of the apparatus of FIG. 3 with the cover closed.

FIG. 5 shows the apparatus according to the invention in the closed position with cover 52 closed and secured with latch 58 fastened about printed circuit board 10 to retain the cover 52 and the printed circuit board together. The padding 62 rests gently against the components 19 to prevent them from falling out of the elements 14a and 14b and 24 when the apparatus is inverted as shown in FIG. 6.

Figure 6:
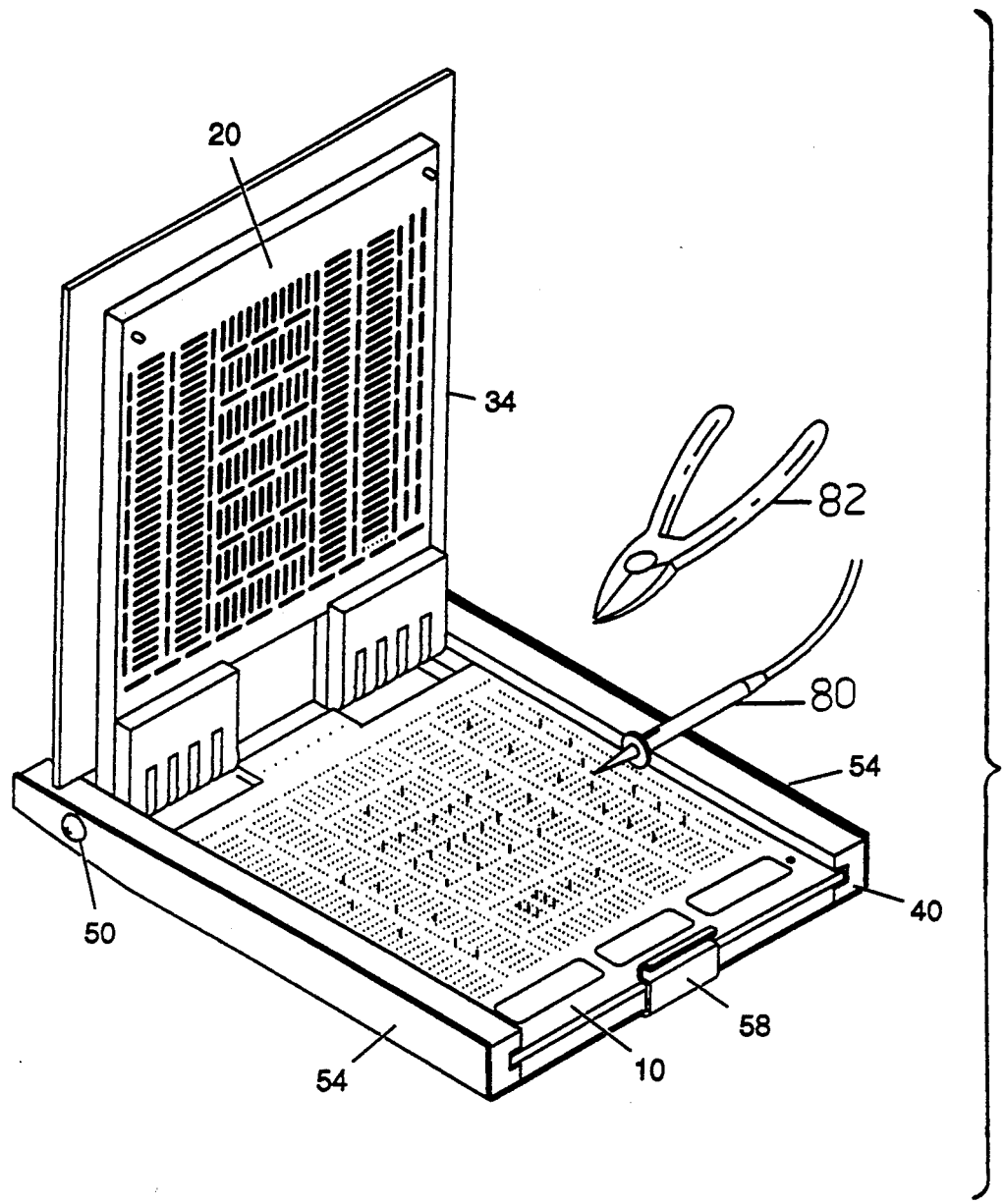
FIG. 6 is a perspective of the apparatus shown in FIG. 3, upside down, with the base board lifted away from the printed circuit board and with the ends of circuit component leads in position for soldering.

FIG. 6 shows the apparatus inverted, with the base board 20 rotated up and away from the underside of the printed circuit board 10. The leads 18 of the components 19 have been freed from the elements 24 and protrude from the underside of the printed circuit board 10. In this condition, no good connection is made between the leads 18, until soldered to the printed circuit board 10 to make an electrical connection with the matrix of the printed circuit board, using the soldering iron 80. Cutters 82 are used to sever the ends of the leads 18 that protrude from the solder.

The method of operation of the apparatus will now be described.

Referring to FIG. 3, the cover 52 pivots on the pivot 50 to allow access for the printed circuit board 10 into the apparatus. The printed circuit board 10 is inserted into the apparatus by sliding it along the side tracking frame 40 until it identifies with the edge connector 46 at the base or closed end of the printed circuit board tracking frame 40. The two lower sections of the apparatus (the printed circuit board tracking frame 40, and the base board 20 with connection matrix) are snapped together with the identifying posts 32 and openings 36 automatically aligning the matrix 12 of the printed circuit board 10 with the connection matrix 22 of the base board 20 thus preparing the system for component insertion.

Referring to FIG. 4, leads 18 of components 19 are inserted through the printed circuit board 10 into the connection matrix 22 thus providing an electrical connection between the components 19. This connection, provided by the elements 24 embedded in the plastic base board 20, is identical to the final connection provided by the copper tracks 14 of the printed circuit board 10. Through the built-in connection interface points or terminals 49 at the closed end of the apparatus, connections are made to the matrix 22 and printed circuit board 10 thus allowing for testing and modification of the circuit for example with the oscilloscope shown.

Referring to FIG. 5, upon completion of the circuit, or to facilitate transport of an uncompleted circuit, the cover 52 of the apparatus with the padding 62 (the compression stage) is pivoted down until it latches into place on the printed circuit board 10 (using the latch 58) and, if desired, the base board 20 (using a further latch, not shown), thus securing all the components from being dislodged.

Referring to FIG. 6, in order to allow access to the solder side (under side) of the printed circuit board 10, the entire apparatus is first inverted, and then base board 20 is rotated away from the printed circuit board 10, tracks 40 and cover 52, with the connection matrix 22 disengaging from the leads 18 of the components 19 on the printed circuit board 10. This exposes the component leads 18 of the circuit, and the solder side of the printed circuit board 10, all held together by the latch 58.

While the components 19 are securely held in place in the printed circuit board 10 by the pressure exerted on the components 19 by the compression stage (cover 52 and padding 62), the component leads 18 are soldered into place on the printed circuit board 10. When all the leads are soldered into place, and the additional length is trimmed from all the leads, the board is complete.

Figure 7:
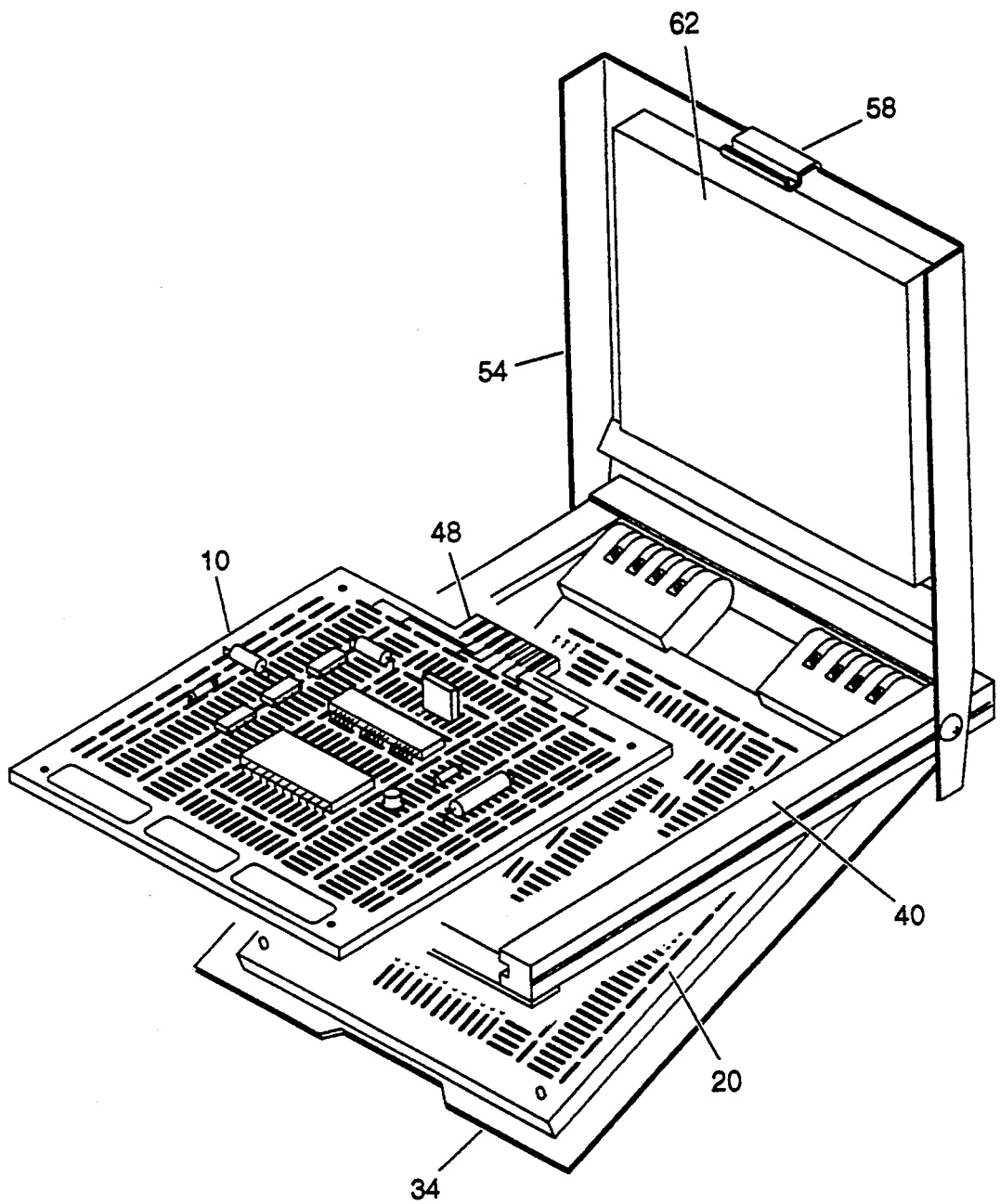
FIG. 7 is a perspective showing the apparatus of FIG. 3 with the prototype printed circuit board being removed from the apparatus.

Referring to FIG. 7, the latch 58 is released from the printed circuit board 10, thus allowing the printed circuit board 10 to be swung clear of both the compression stage (cover 52 and padding 62) and the base board 20, thus allowing the completed and tested printed circuit board 10 to be removed from the apparatus. The completed printed circuit board 10 is ready for insertion into whatever application it was designed for.

Alternative Embodiments

A person skilled in the art could make immaterial modifications to the invention described and claimed in this patent without departing from the essence of the invention.

I claim:

1. A circuit board assembly system for manufacturing a prototype printed circuit board having a matrix formed in it, the assembly system comprising:
   a base board having a connection matrix that matches the matrix of the printed circuit board; and
   positioning means connectable to each of the base board and the printed circuit board for locating the printed circuit board in a fixed position relative to the base board with a one to one correspondence between the matrix of the printed circuit board and the connection matrix of the base board.

2. The circuit board assembly of claim 1 in which the positioning means includes a tracking frame for slidably receiving the printed circuit board, the tracking frame being pivotally connected to the base board by a pivot at one end of the base board.

3. The circuit board assembly or claim 2 further including a cover for the printed circuit board, the cover being pivotally attached at the open end to the base and the tracking frame with the tracking frame between the base and the cover.

4. The circuit board assembly of claim 3 further including means to secure the cover on the printed circuit board.

5. The circuit board assembly of claim 4 in which the cover includes padding on the side of the cover adjacent the tracking frame.

6. The circuit board assembly of claim 3 in which the cover includes padding on the side of the cover adjacent the tracking frame.

7. A method of constructing a prototype board using a base board having a connection matrix, the prototype board having a matching matrix that matches the connection matrix, the method comprising the steps of:
- locating the prototype board in a fixed position relative to the base board with the matching matrix aligned with the connection matrix;
- inserting components having leads into the prototype board with the leads extending into the base board in electrical connection with the connection matrix to form a circuit;
- testing the circuit;
- removing the base board from the fixed position in relation to the prototype board; and
- soldering the leads of the components into the prototype board.

8. The method of claim 7 in which locating the prototype board in a fixed position relative to the base board includes:
- sliding the prototype board into a tracking frame that is pivotally attached to the base board; and
- pivoting the tracking frame in relation to the base board until the prototype board and the base board are aligned.

9. The method of claim 8 in which removing the base board from the fixed position in relation to the prototype board includes:
- pivoting the tracking frame away from the base board.

10. The method of claim 9 further including, before removing the base board from the fixed position in relation to the prototype board, covering the printed circuit board and the components on it with a cover and inverting the prototype board.

11. The method of claim 10 further including soldering the leads of the components while maintaining the cover in place.

* * * * *